United States Patent
Ding et al.

(10) Patent No.: US 11,152,935 B2
(45) Date of Patent: Oct. 19, 2021

(54) SYSTEM AND METHOD TO DELIVER RESET VIA POWER LINE

(71) Applicant: Google LLC, Mountain View, CA (US)

(72) Inventors: Yao Ding, San Jose, CA (US); Guang Xie, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/115,022

(22) Filed: Aug. 28, 2018

(65) Prior Publication Data

US 2020/0076420 A1 Mar. 5, 2020

(51) Int. Cl.
*H03K 17/20* (2006.01)
*H03K 17/22* (2006.01)

(52) U.S. Cl.
CPC .............. *H03K 17/20* (2013.01); *H03K 17/22* (2013.01)

(58) Field of Classification Search
CPC .............................. H03K 17/20; H03K 17/22
See application file for complete search history.

(56) References Cited

U.S. PATENT DOCUMENTS

| | | | |
|---|---|---|---|
| 3,703,648 A | 11/1972 | Wrabel | |
| 5,896,025 A * | 4/1999 | Yamaguchi | H02J 7/0031 320/134 |
| 2007/0152724 A1 * | 7/2007 | Chiu | G06F 1/24 327/198 |
| 2009/0134934 A1 | 5/2009 | Hung et al. | |
| 2016/0087480 A1 | 3/2016 | Trudeau et al. | |

(Continued)

FOREIGN PATENT DOCUMENTS

| | | |
|---|---|---|
| DE | 2936683 B1 | 5/1980 |
| DE | 202012103205 U1 | 11/2012 |
| WO | 2017155462 A1 | 9/2017 |

OTHER PUBLICATIONS

Rovtop, Rovtop Fitbit Alta HR Charger with Reset Button, 2 Packs100cm/3.3ft Replacement USB, Retrieved from Internet Jul. 3, 2018, <Home (http://www.rovtop-tech.com) / Electronics & Photo (http://www.rovtop-tech.com/productcategoryielectronics-photo/) / Rovtop Fitbit Alta HR Charger with Reset Button, 2 Packs 100cm/3.3ft Replacement USB Charger Charging Cables for Fitbit Alta HR ,Not for Fitbit Alta>, 7 pages.

(Continued)

*Primary Examiner* — Diana J. Cheng
(74) *Attorney, Agent, or Firm* — Lerner, David, Littenberg, Krumholz & Mentlik, LLP (57) ABSTRACT

The present disclosure describes a system and method for resetting firmware in an electronic accessory, such as a wearable electronic device, without a physical reset button on the accessory. A secondary device, such as a case for the accessory, can serve as a power source that initiates the reset. The reset may be manually initiated, for example by a user pressing a button, or automatically initiated, such as by the secondary device detecting that the accessory is unresponsive. The secondary device sends a reset command to the electronic accessory through a power line connection. The power line connection may be made, for example, upon contact of the accessory with the secondary device. In some examples, the reset command may be an elevated power level. Upon receiving the reset command through the power line, the accessory completes the reset.

18 Claims, 6 Drawing Sheets

(56) References Cited

U.S. PATENT DOCUMENTS

2017/0366011 A1* 12/2017 Li .......................... H02J 3/381
2018/0041826 A1*  2/2018 Toosi .................. H04R 1/1016
2018/0091884 A1   3/2018 Minoo et al.

OTHER PUBLICATIONS

International Search Report and Written Opinion for International Application No. PCT/US2019/044690 dated Nov. 12, 2019. 15 pages.
International Preliminary Report on Patentability for International Application No. PCT/US2019/044690 dated Mar. 11, 2021. 9 pages.

* cited by examiner

SYSTEM AND METHOD TO DELIVER RESET VIA POWER LINE

BACKGROUND

Wearable products are typically physically small, with water tight enclosures and elegant industrial design. Systems embedded within the wearable products may be controlled by firmware. In some instances, the embedded systems may experience a lock up or program hang as a result of hardware operation exceptions or program bugs. While a typical remedy is to include a reset button for the embedded systems, this is undesirable in many cases. Particularly for wearable products, adding a reset button may interfere with an otherwise sleek and ergonomic product design, or sometimes, there is no room to add a button at all.

BRIEF SUMMARY

Reset signals may be delivered via a power connection from a power source to a power receiver. The power source may reside in, for example, a case for the wearable product, while the power receiver resides in the wearable product itself. A reset may be initiated by an event, such as a long press of a power button on the case. During such event, the power source detects if the power receiver is attached but unresponsive. If so, the power source raises the output voltage to initiate a reset. When the power receiver receives the elevated voltage, it performs a reset operation.

One aspect of the disclosure provides a system for resetting a wireless device, including a first electronic device including one or more first contacts, wherein the first electronic device is adapted to transmit a first voltage and a second voltage higher than the first voltage, and a second electronic device. The second electronic device includes one or more second contacts configured to mate with the first contacts to form an electrical connection with the first device, and a battery, wherein the battery of the second electronic device is configured to receive a charge when the first voltage is transmitted by the first device over the electrical connection. The second electronic device is adapted to perform a reset when the second voltage is transmitted by the first device over the electrical connection.

The first electronic device may include a first voltage source that generates the first voltage and a second voltage source that generates the second voltage. It may further include a switch adapted to select between the first voltage source and the second voltage source, and a power control unit adapted to control the switch in response to a reset-initiating event. Further, the first device may include one or more processors in communication with the power control unit, the one or more processors configured to detect whether a predetermined condition is present.

The second device may further include a Zener diode, a transistor, and a reset pin coupled to the transistor, wherein the second voltage activates the Zener diode, the Zener diode passes the voltage to the transistor, and the transistor emits the voltage to activate the reset pin. The second device may be, for example, a wearable electronic device, such as an earbud. The first device may be, for example, a case for the wearable device.

Another aspect of the disclosure provides a power source device, including one or more first contacts adapted to establish an electrical connection with a power receiver device, one or more voltage sources adapted to generate a first voltage and a second voltage higher than the first voltage, and a power control unit configured to select one of the first voltage or the second voltage for transmission over the electrical connection.

The power control unit may include one or more processors configured to detect a reset-initiating event and select the second voltage in response to detecting the reset-initiating event. The reset-initiating event may be a manually triggered event, such as activation of a manual control on the power source device. In other examples it may be an automatically triggered event, such as by detection of a presence of the power receiver device in an unresponsive state.

Yet another aspect of the disclosure provides a power receiver device, including one or more contacts configured to establish an electrical connection with a power source device, a battery adapted to receive a charge through the electrical connection, and circuitry configured to differentiate a first voltage level received over the electrical connection from a second voltage level, higher than the first voltage level, received over the electrical connection, wherein the first voltage level is supplied to the battery for charging the battery, and wherein the second voltage level initiates a reset of firmware in the power receiver device.

The circuitry may include a Zener diode activated by the second voltage level, a transistor coupled to the Zener diode, and a reset pin coupled to an output of the transistor. It may further include a power management circuit including the reset pin, wherein the power management circuit is configured to complete a reset process.

DETAILED DESCRIPTION

The present disclosure describes a system and method for resetting firmware in an electronic accessory, such as a wearable electronic device, without a physical reset button on the accessory. A secondary device, such as a case for the accessory, can serve as a power source that initiates the reset. The reset may be manually initiated, for example by a user pressing a button, or automatically initiated, such as by the secondary device detecting that the accessory is unresponsive. The secondary device sends a reset command to the electronic accessory through a power line connection. The power line connection may be made, for example, upon contact of the accessory with the secondary device. In some examples, the reset command may be an elevated power level. Upon receiving the reset command through the power line, the accessory completes the reset.

Example Systems

Figure 1:
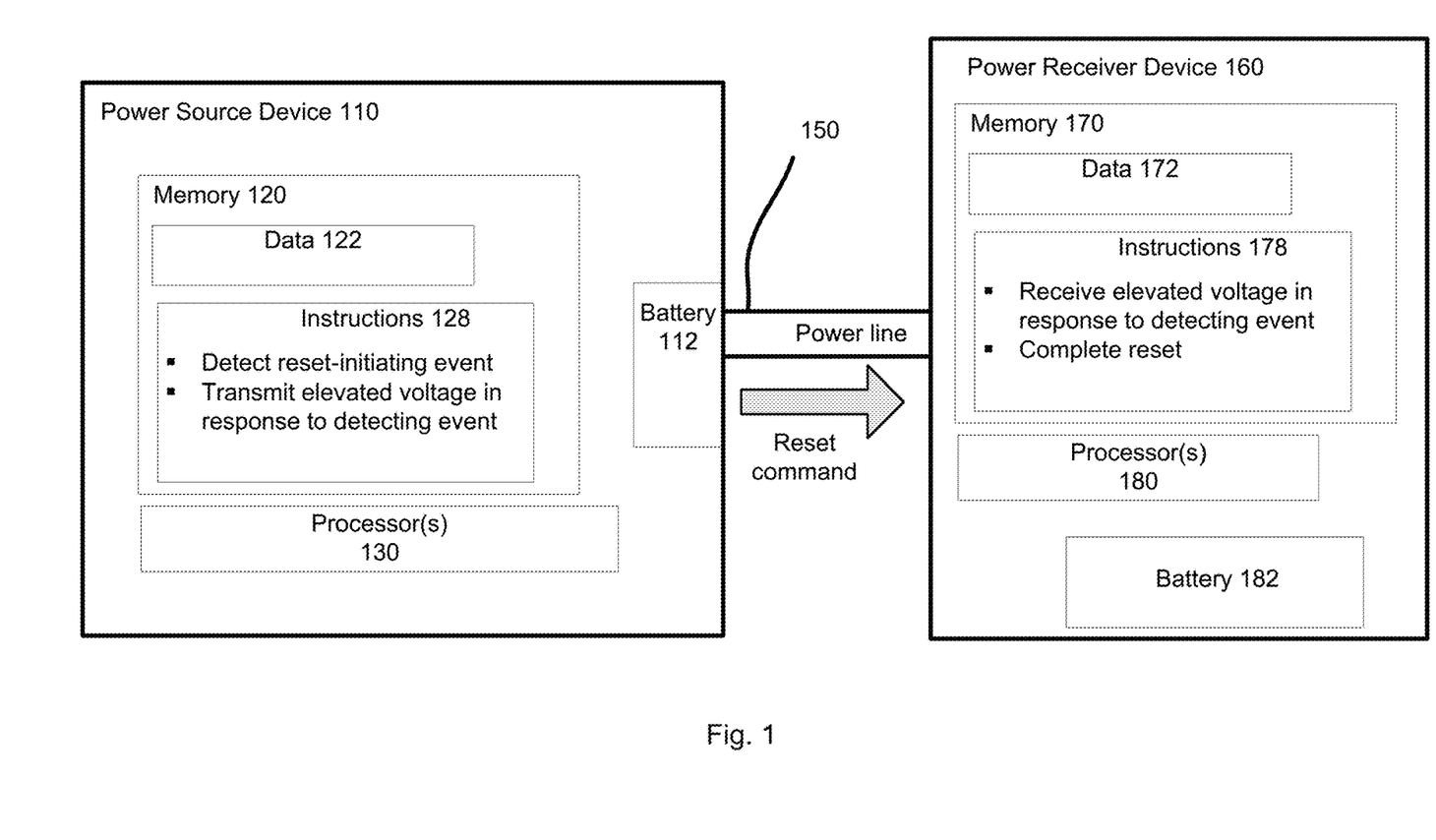
FIG. 1 is a functional block diagram illustrating an example system according to aspects of the disclosure.

FIG. 1 illustrates an example of a first electronic device 110 which supplies power to a second electronic device 160.

For example, the first electronic device 110 includes a power source, such as a battery 112, which can supply a charge to battery 182 of the second electronic device 160. The first and second electronic devices 110, 160 may be electronically coupled, for example, via power line 150. While the power line 150 is shown as a line between the two devices 110, 160, it should be understood that each of the first and second electronic devices 110, 160 may include its own power line terminating in one or more contacts, and that the electronic coupling of the two devices may be formed when the contacts on the first electronic device 110 meet the contacts of the second electronic device 160. Moreover, while only one second electronic device 160 is shown, the first electronic device 110 may be coupled to multiple second electronic devices simultaneously. For example, the first electronic device 110 may be simultaneously coupled to two earbuds, and initiate a hard reset for either earbud or both simultaneously. In other examples, the first electronic device 110 may be electronically coupled directly with one earbud serving as a master, which causes both earbuds to reset.

The charge from the first device 110 to the second device 160 may be supplied through the power line 150. As shown in FIG. 1, a reset command may also be supplied from the first electronic device 110 to the second electronic device 160 over the power line 150. According to some examples, the reset command may take the form of an elevated voltage level, as compared to a voltage level transmitted from the first device 110 to the second device 160 when charging the battery 182 of the second device 160 by the battery 112 of the first device 110.

The first electronic device 110 may include one or more processors 130, one or more memories 120, as well as other components. For example, the computing device 110 may include a battery 112.

The memory 120 may store information accessible by the one or more processors 130, including data 122 and instructions 128 that may be executed or otherwise used by the one or more processors 130. For example, memory 120 may be of any type capable of storing information accessible by the processor(s), including a computing device-readable medium, or other medium that stores data that may be read with the aid of an electronic device, such as a volatile memory, non-volatile as well as other write-capable and read-only memories. By way of example only, memory 120 may be a static random-access memory (SRAM) configured to provide fast lookups. Systems and methods may include different combinations of the foregoing, whereby different portions of the instructions and data are stored on different types of media.

The data 122 may be retrieved, stored, or modified by the one or more processors 130 in accordance with the instructions 128. For instance, data 122 may include an identification of conditions which indicate whether a reset of the second device 160 should be initiated. For example, a set of conditions may indicate that a reset event occurred. By way of example only, the reset event may include activation of a particular switch or button or the like, depression of one or more buttons for a predetermined period of time, movement of the first device in a particular way, detection of a particular state of the second device, etc. Although the claimed subject matter is not limited by any particular data structure, the data may be stored in computing device registers, in a relational database as a table having a plurality of different fields and records, XML documents or flat files. The data may also be formatted in any computing device-readable format.

The instructions 128 may be any set of instructions to be executed directly (such as machine code) or indirectly (such as scripts) by the one or more processors 130. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The one or more processors 130 may be microprocessors, logic circuitry (e.g., logic gates, flip-flops, etc.) hard-wired into the device 110 itself, or may be a dedicated application specific integrated circuit (ASIC). It should be understood that the one or more processors 130 are not limited to hard-wired logic circuitry, but may also include any commercially available processing unit, or any hardware-based processors, such as a field programmable gate array (FPGA). In some examples, the one or more processors 130 may include a state machine.

The second device 160, serving as the power receiver device, may include components similar to those of the first device 110. For example, the second device 160 may include memory 170 including data 172 and instructions 178, one or more processors 180, a battery 182, and other components typically found in electronic accessories. The instructions 178 may be executed by the one or more processors 180 to complete the firmware reset upon receipt of the reset command from the first electronic device 110.

Figure 2:
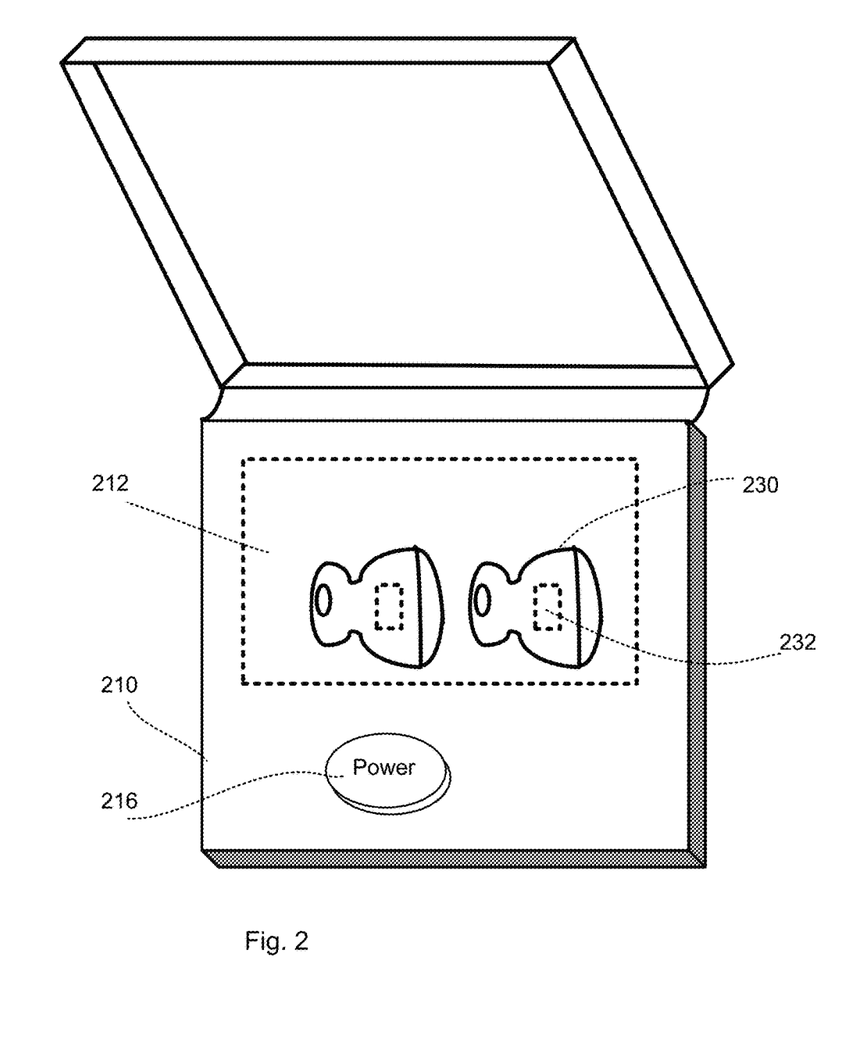
FIG. 2 is an example pictorial diagram of the system of FIG. 1.

FIG. 2 provides a pictorial diagram illustrating an example of the devices of FIG. 1. As shown in this example, the first electronic device is a case 210 and the second electronic device is a pair of earbuds 230. The earbuds 230 may be wireless in that they do not require a wired connection to a music player, phone, or other device to be powered. In some examples, each earbud may further be wireless from one another. The earbuds 230 include one or more batteries 232 which provide power to the earbuds 230 and other components therein, such as transmitters, receivers, amplifiers, sensors, etc. The batteries 232 of the earbuds 230 may be relatively small, in view of the small size of the earbuds 230. The case 210 in which the earbuds 230 are shipped and stored may have a larger battery 212. This larger battery 212 of the case 210 may deliver a charge to the smaller batteries 232 of the earbuds 230.

When the earbuds 230 are placed inside the case 210 in a given orientation, contacts (not shown) on the earbuds 230 may come into contact with contacts on the case 210 to establish an electrical connection, including a power line connection. In some examples, each earbud may operate independently, and thus a power line connection is established with a first earbud, while separate power line connection is established with a second earbud.

The case 210 delivers a reset command to the earbuds 230 through the power line connection. For example, the reset may be initiated at the case 210 by a particular event. The particular event may be user-initiated or automatically initiated. Examples of possible user-initiated events include pressing a designated reset button, pressing and holding another button 216 on the case 210 for an extended period of time, e.g. 5 seconds, 30 seconds, etc., rotating or moving the case in a particular direction or motion, or the like. Examples of automatically initiated resets include detection of earbuds 230 being present but unresponsive after a timeout period. For example, if batteries 232 on the earbuds 230 are fully drained, the earbuds 230 may typically begin charging upon placement in the case 210, and turn on and respond within a predetermined period of time (e.g., 5 seconds). If the predetermined period of time passes and the earbuds 230 remain unresponsive, despite sufficient charge in the battery 212 of the case 210, a reset may automatically be initiated.

While the example of FIG. 2 illustrates the first electronic device as a case and the second electronic device as an earbud, it should be understood that delivery of a reset command over a power line may be implemented in any of a variety of devices. By way of example only, the electronic devices may include any of a smartwatch, fitness tracker, head-mounted display, phone, phone accessories, toys, gaming systems, tablets, etc.

Figure 3:
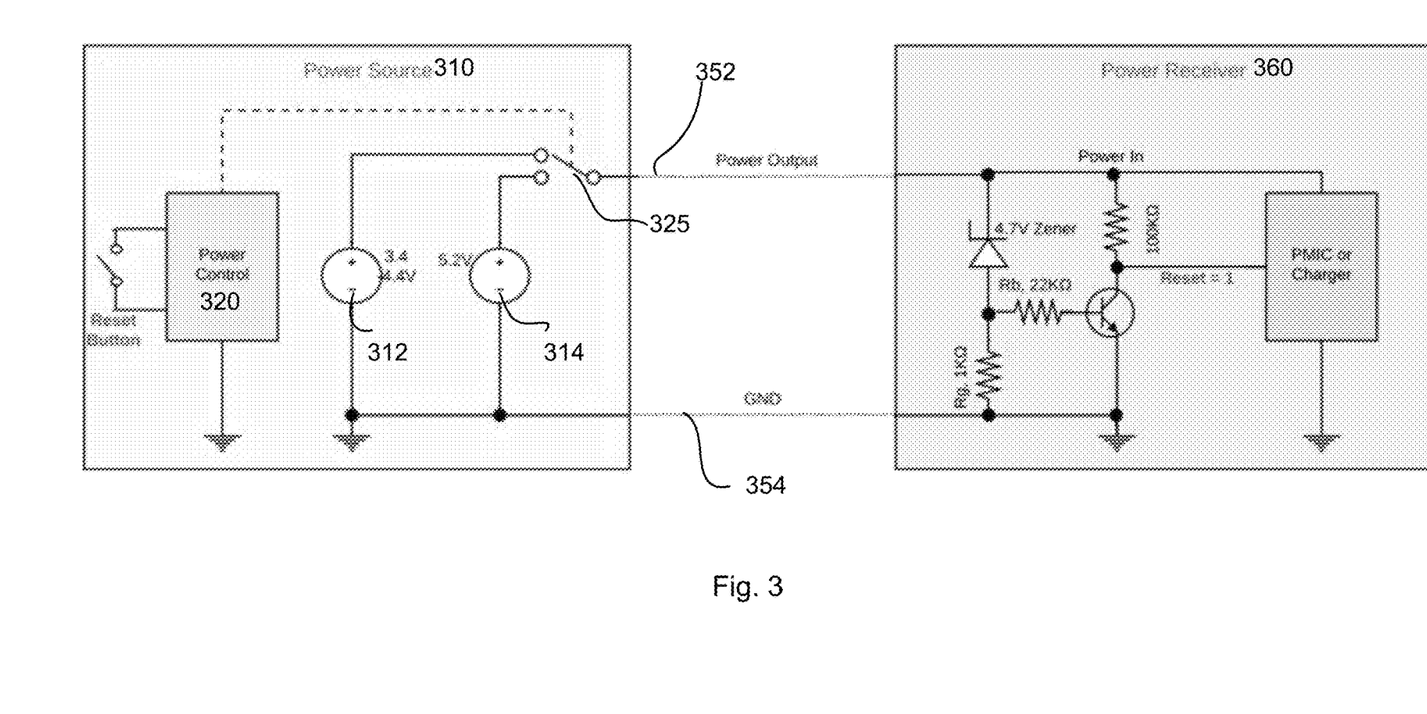
FIG. 3 is an example circuit diagram of the system of FIG. 1.

FIG. 3 provides an example circuit diagram of the system of FIG. 1. A first device is a power source device 310, such as a case for an electronic accessory. A second device is a power receiver device 360, such as an earbud. The power source 310 and power receiver 360 are electronically coupled via a power line connection 352 and a ground line connection 354. The power source 310 includes a first voltage source 312 and a second voltage source 314, where the second voltage source 314 is higher than the first voltage source 312. Switch 325 may be used to select between the first voltage source 312 and the second voltage source 314 for transmission over the power line 352. For example, the first voltage source 312 may transmit over the power line 352 for charging a battery of the power receiver 360, while the second voltage source 314 may transmit over the power line 352 for resetting the power receiver device 360. The switch 325 may be activated by a power control unit 320.

The first voltage source 312 and second voltage source 314 are both coupled between the power line 352 and the ground line 354, while the switch 325 provides for selection between the first and second voltage sources 312, 314.

In this example, the first voltage source 312 outputs approximately 3.4V-4.4V. For example, the first voltage source 312 may be a Buck-boost regulator. It should be understood, however, that the type of voltage source may be varied, and the voltage level output may be varied. For example, some electronic devices may require higher voltage levels for charging, and thus the first voltage source 312 may be higher for such devices. Similarly, other devices may only require a lower voltage for charging.

The second voltage source 314 outputs an elevated voltage level as compared to the first voltage source 312. In this example, the second voltage source 314 outputs approximately 5.2V. While higher voltage levels may be used, in some examples the elevated voltage level may be only marginally higher than the first voltage source 312, such as to conserve power. Accordingly, the voltage levels from the second voltage source 314 may be relative to the voltage level of the first power source 312. For example, if in other examples the voltage level of the first voltage source 312 is higher, such as 6V, the voltage level of the second voltage source 314 may also be higher, such as 7V.

The power control unit 320 may select between the first voltage 312 and the second voltage 314, for example, using the switch 325. The power control unit 320 may be, for example, a MCU, a System On Chip (SOC), an ASIC, or a FPGA/CPLD, etc. The power control unit 320 may detect a reset event, such as a press of a reset button or presence of an unresponsive power receiver device 360. For example, the power control unit 320 may be coupled to a reset switch 325 that closes a circuit when a reset button is pushed.

The power control unit 320 may activate the switch 325 in response to detecting the reset event. For example, the switch 325 may by default close a circuit between the first voltage source 312 and the power line 352, such that the lower level voltage is transmitted over the power line 352 by default. When the switch 325 is activated by the power control unit 320 upon a reset event, it instead closes the circuit between the second voltage source 314 and the power line 352, such that the higher level voltage is transmitted over the power line 352. Such transmission of higher level voltage may serve as a reset command to the power receiver device 360.

The receiver device 360 includes a Zener diode 362 at an end of the power line 352. The Zener diode 362 is coupled to a transistor 364, which is further coupled to a charging unit 368, such as a power management integrated circuit (PMIC), a charger, a MCU, SOC, etc.

The Zener diode 362 may be in an off state by default. When the power receiver device 360 receives the elevated voltage from the power source device 310, the elevated voltage turns on the Zener diode 362. When the Zener diode 362 conducts, the current will pass through resistor 374 to a base of the transistor 364, thereby turning on the transistor 364. The transistor 364, having a current at its base, turns a collector of the transistor 364 to ground 366. The output from the transistor 364 pulls a reset pin 382 to an active state. For example, the transistor 364 may pull the reset pin 382 low. Activating the reset pin 382 triggers the charging unit or MCU 368 to perform a reset. In the case that charging unit 368 is coupled directly to the reset signal 382, the charging unit 368 can output a reset to MCU (not shown), or turning system power off shortly and back on again etc., to allow the system to have a clean start.

Figure 4:
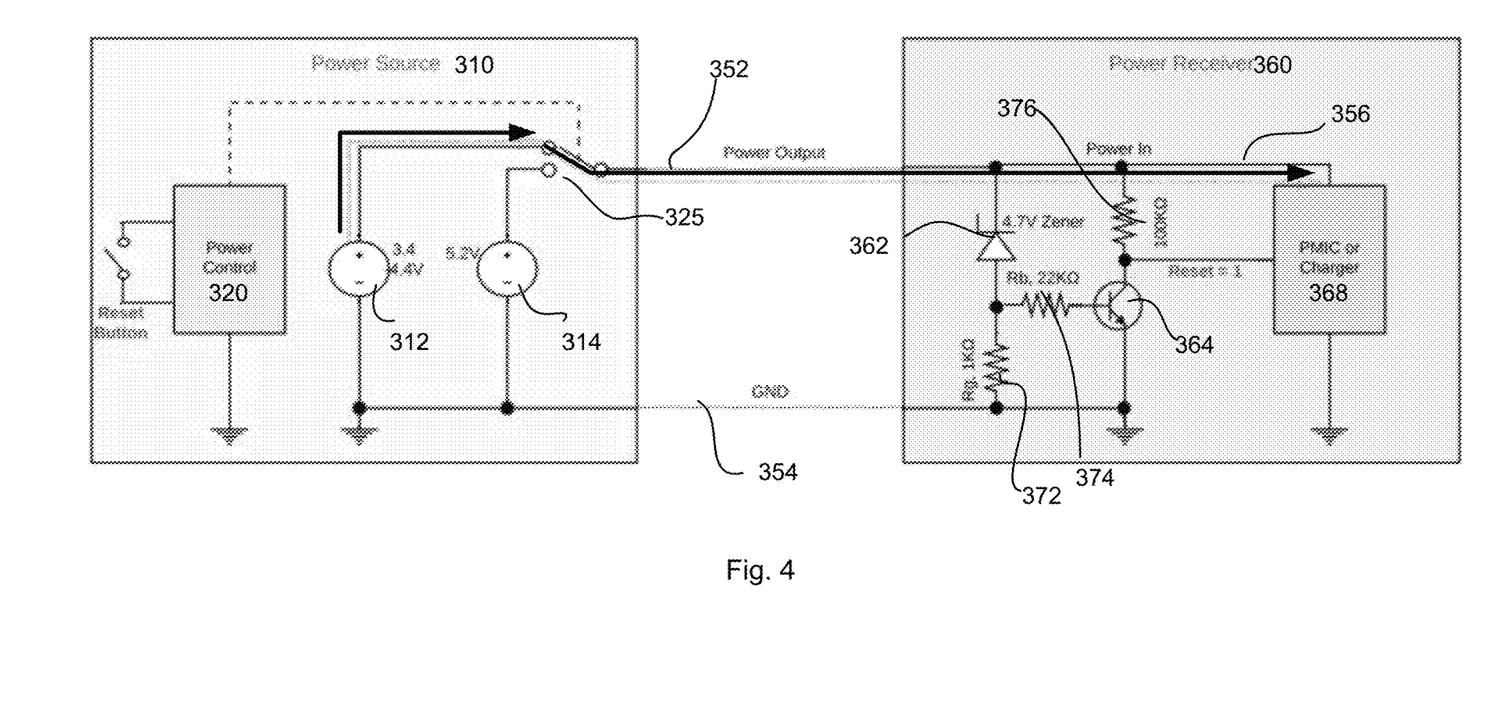
FIG. 4 illustrates the example circuit of FIG. 3 in a first mode of operation according to aspects of the disclosure.

FIG. 4 illustrates the example circuit diagram of FIG. 3 in a first mode of operation, such as a charging mode. According to some examples, the charging mode may be a default mode of operation. In this mode, the switch 325 couples the first voltage source 312 to power line 352. As such, a first voltage is transmitted over the power line 352 to the power receiver 360. At the power receiver 360, the first voltage is not high enough to turn on the Zener diode 362. Accordingly, the current flows through power-in line 356 to the charging unit 368, thereby recharging a battery of the power receiver device 360.

Figure 5:
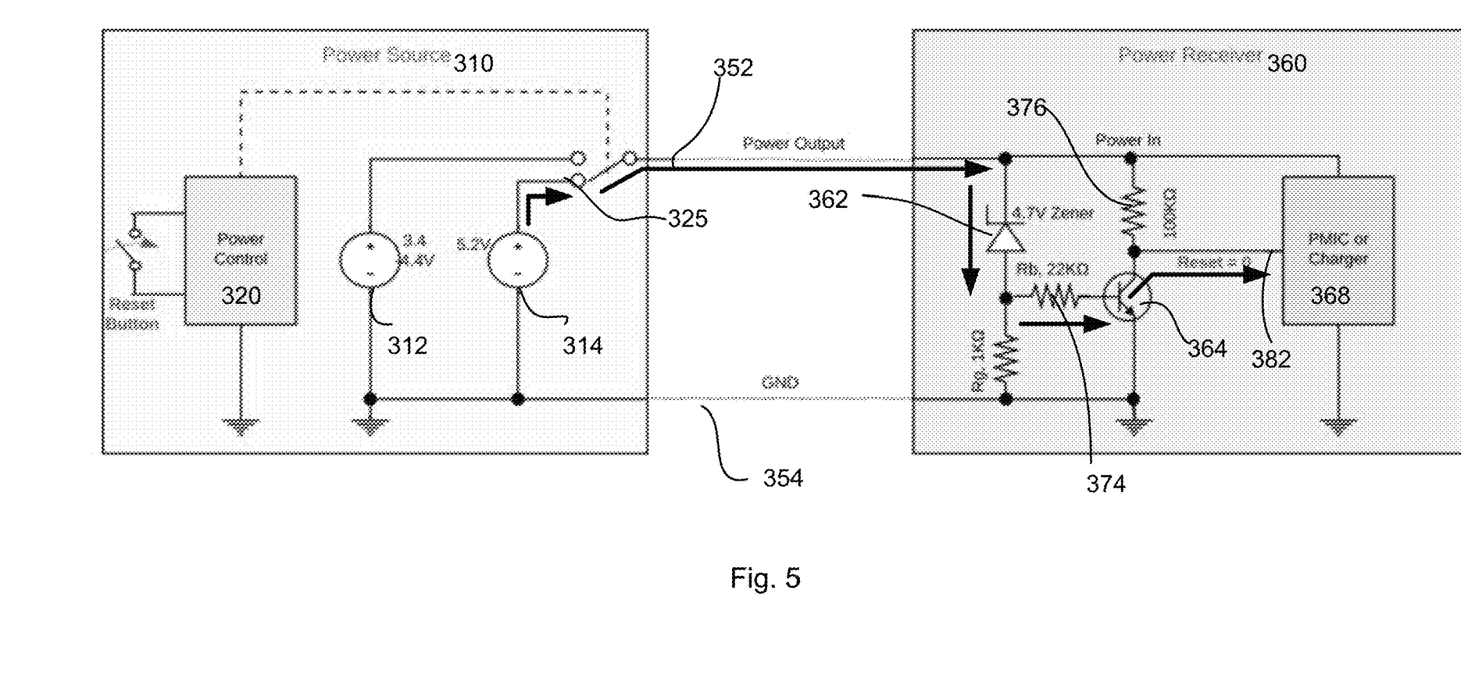
FIG. 5 illustrates the example circuit of FIG. 3 in a second mode of operation according to aspects of the disclosure.

FIG. 5 illustrates the example circuit diagram of FIG. 3 in a second mode of operation, such as a reset mode. As mentioned above, the reset mode may be initiated manually, such as by a button push, or automatically, such as by detection of a predetermined condition. Power control unit 320 causes the switch 325 to close the circuit with the second voltage source 314, thereby allowing the second voltage source 314 to transmit the higher voltage over the power line 352. The higher voltage, when received at the Zener diode 362 of the power receiver device 360, turns on the Zener diode 362 which causes current to be passed to a base of the transistor 364. The transistor 364, when turned on, emits the current to pull the reset pin 382 into an active state. Accordingly, the charging circuit 368 is triggered by the reset pin 382 to perform a firmware reset.

Example Methods

In addition to the operations described in connection with the systems above, various operations will now be described in connection with example methods. It should be understood that the following operations do not have to be performed in the precise order described below. Rather, various operations can be handled in a different order or simultaneously, and operations may also be added or omitted.

Figure 6:
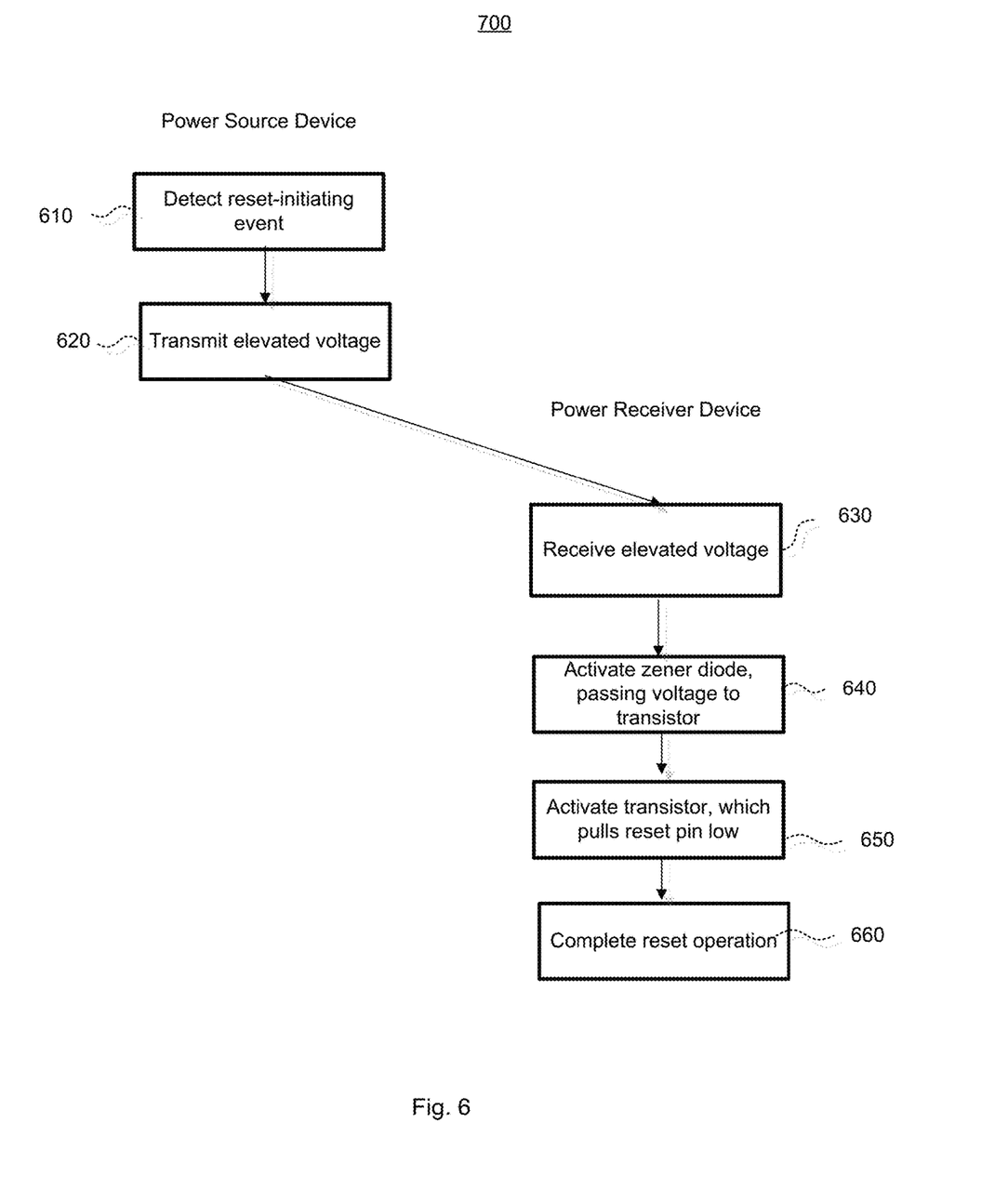
FIG. 6 is a flow diagram illustrating an example method according to aspects of the disclosure.

FIG. 6 provides a flow diagram illustrating an example method 700 of using a first device to reset a second device. The devices may include any type of electronic devices, such as earbuds, a phone, phone accessories, toys, gaming systems, tablets, etc. The first device serves as a power source device, while the second device serves as a power receiver device.

In block 610, the power source device detects a reset-initiating event. For example, the power source device may detect a particular button push, movement, environmental condition, status of the power receiver device, etc. The power source device may be programmed to associate such detected event with a command to reset the power receiver device.

In block 620, the power source device transmits an elevated voltage to the power receiver device, as compared to a typical voltage transmitted for charging the power receiver device, etc. For example, the power source device may include a voltage source adapted to transmit at various voltage levels. In other examples, the power source device may include two or more voltage sources, each adapted to transmit at different voltage levels, with a switch therebetween.

In block 630, the elevated voltage is received at the power receiver device. For example, the voltage may be received over a power line connection between contacts of the power source device and the power receiver device.

In block 640, the elevated voltage activates a Zener diode at the power receiver device, passing the voltage to a transistor. In block 650, the transistor is activated, and pulls a reset pin low to activate the reset pin. In block 660, the power receiver device completes a reset operation. For example, activation of the reset pin may cause a power management circuit to perform a reset of the device firmware, or cycle the power voltage.

The foregoing systems and methods are advantageous in that they provide a mechanism for resetting a wearable device, which may otherwise be too small and sleek for inclusion of a separate reset control. While in the foregoing examples the increased voltage level is transmitted to trigger a system reset, in other examples the increased voltage level may be transmitted to initiate other actions, e.g. perform a power voltage cycling, to get a system clean cold start.

While some of the foregoing examples are described in relation to a case delivering a reset to an accessory, such as a pair of earbuds, it should be understood that other examples of the system and method may include any of a number of other electronic devices. By way of example only, the reset may be delivered over a power line connection between an inductive charging device, such as a wireless phone charger, and a cell phone or other small electronic device.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A system for resetting a wireless device, comprising:
    a first electronic device including one or more first contacts, wherein the first electronic device includes a power control unit, and one or more voltage sources within the first electronic device, and wherein the one or more voltage sources are adapted to transmit a first voltage and a second voltage higher than the first voltage, and wherein the power control unit is configured to select one of the first voltage or the second voltage for transmission; and
    a second electronic device, comprising:
        one or more second contacts configured to mate with the first contacts to form an electrical connection with the first device; and
        a battery, wherein the battery of the second electronic device is configured to receive a charge when the first voltage is transmitted by the first device over the electrical connection;
        wherein the second electronic device is adapted to perform a reset when the second voltage is transmitted by the first device over the electrical connection.

2. The system of claim 1, wherein the first electronic device comprises a first voltage source that generates the first voltage and a second voltage source that generates the second voltage.

3. The system of claim 2, wherein the first electronic device comprises:
    a switch adapted to select between the first voltage source and the second voltage source; and
    the power control unit adapted to control the switch in response to a reset-initiating event.

4. The system of claim 3, wherein the first device includes one or more processors in communication with the power control unit, the one or more processors configured to detect whether a predetermined condition is present.

5. The system of claim 1, wherein the second device further comprises:
    a Zener diode;
    a transistor; and
    a reset pin coupled to the transistor;
    wherein the second voltage activates the Zener diode, the Zener diode passes the voltage to the transistor, and the transistor emits the voltage to activate the reset pin.

6. The system of claim 1, wherein the second device is a wearable electronic device.

7. The system of claim 6, wherein the second device is an earbud and the first device is a case for the earbud.

8. A power source device, comprising:
    one or more first contacts adapted to establish an electrical connection with a power receiver device;
    one or more voltage sources within the power source device adapted to generate a first voltage and a second voltage higher than the first voltage; and
    a power control unit configured to select one of the first voltage or the second voltage for transmission over the electrical connection, wherein the power control unit is configured to detect a reset-initiating event and select the second voltage in response to detecting the reset-initiating event.

9. The power source device of claim 8, wherein the power control unit comprises one or more processors.

10. The power source device of claim 9, wherein the reset-initiating event is a manually triggered event.

11. The power source device of claim 10, wherein the reset-initiating event includes activation of a manual control on the power source device.

12. The power source device of claim 9, wherein the reset-initiating event includes detection of a presence of the power receiver device in an unresponsive state.

13. The power source device of claim 8, wherein the device is a case for a wireless electronic accessory.

14. A power receiver device, comprising:
one or more contacts configured to establish an electrical connection with a power source device;
a battery adapted to receive a charge through the electrical connection; and
circuitry configured to differentiate a first voltage level received over the electrical connection from a second voltage level, higher than the first voltage level, received over the electrical connection, wherein the first voltage level is supplied to the battery for charging the battery, and wherein the second voltage level initiates a reset of firmware in the power receiver device, wherein the circuitry comprises a Zener diode activated by the second voltage level to initiate the reset of firmware in the power receiver device.

15. The power receiver device of claim 14, wherein the circuitry comprises:
a transistor coupled to the Zener diode; and
a reset pin coupled to an output of the transistor.

16. The power receiver device of claim 15, wherein the circuitry further comprises a power management circuit including the reset pin, wherein the power management circuit is configured to complete a reset process.

17. The power receiver device of claim 14, wherein the power receiver device is a wearable electronic device.

18. The power receiver device of claim 17, wherein the power receiver device is an earbud.

* * * * *